(12) United States Patent
Tamaoki

(10) Patent No.: US 7,344,264 B2
(45) Date of Patent: Mar. 18, 2008

(54) FRIGHTENING APPARATUS

(75) Inventor: Satoshi Tamaoki, Miyagi-ken (JP)

(73) Assignee: Labosphere Institute (JP)

( * ) Notice: Subject to any disclaimer, the term of this patent is extended or adjusted under 35 U.S.C. 154(b) by 0 days.

(21) Appl. No.: 10/257,844

(22) PCT Filed: Apr. 23, 2001

(86) PCT No.: PCT/JP01/03462

§ 371 (c)(1),
(2), (4) Date: Oct. 17, 2002

(87) PCT Pub. No.: WO01/80635

PCT Pub. Date: Nov. 1, 2001

(65) Prior Publication Data

US 2003/0174504 A1   Sep. 18, 2003

(30) Foreign Application Priority Data

Apr. 21, 2000  (JP) .............................. 2000-120832

(51) Int. Cl.
*F21V 21/30* (2006.01)
(52) U.S. Cl. .................. 362/35; 362/500; 362/470
(58) Field of Classification Search ................ 362/470, 362/800, 230, 231, 103, 108, 186, 310, 311, 362/545, 244, 35; 116/22 A; 119/908; 367/183; 340/815.45, 815.5, 981, 982, 815.4; 40/441
See application file for complete search history.

(56) References Cited

U.S. PATENT DOCUMENTS

| 1,671,770 | A | * | 5/1928 | Levien | 362/35 |
|---|---|---|---|---|---|
| 1,839,055 | A | * | 12/1931 | Seegelken | 40/441 |
| 1,876,625 | A | * | 9/1932 | Daugherty | 40/441 |
| 2,215,900 | A | * | 9/1940 | Bitner | 362/309 |
| 2,254,961 | A | * | 9/1941 | Harris | 362/327 |
| 2,254,962 | A | * | 9/1941 | Bitner et al. | 362/327 |
| 2,469,080 | A | * | 5/1949 | Rosin et al. | 362/327 |
| 2,908,197 | A | * | 10/1959 | Wells et al. | 340/815.76 |
| 3,774,086 | A | * | 11/1973 | Vincent, Jr. | 257/95 |
| 3,875,456 | A | * | 4/1975 | Kano et al. | 313/501 |
| 3,916,181 | A | * | 10/1975 | Smith | 362/35 |
| 4,033,002 | A | * | 7/1977 | Higgs | 441/26 |
| 4,124,880 | A | * | 11/1978 | Dart et al. | 362/35 |

(Continued)

FOREIGN PATENT DOCUMENTS

EP          0635744 A2     1/1995

(Continued)

*Primary Examiner*—Hargobind S. Sawhney
(74) *Attorney, Agent, or Firm*—Kilpatrick Stockton LLP

(57) ABSTRACT

A first light-emitting unit (11*a*), a second light-emitting unit (11*b*), . . . are disposed near a tip vicinity of a spinner cover (1) of a propeller (2). The first light-emitting unit (11*a*) embraces a first bulk-shaped lens of bullet-like, and a semiconductor light-emitting element is installed in a cavity of the first bulk-shaped lens. The second light-emitting unit (11*b*) embraces a second bulk-shaped lens of bullet-like, and a semiconductor light-emitting element installed in a cavity of the second bulk-shaped lens. The first light-emitting unit (11*a*) and the second light-emitting unit (11*b*) are formed so as to be able to attach to and detach from the spinner cover (1) as an attachment (4) for bird strike protection.

2 Claims, 10 Drawing Sheets

U.S. PATENT DOCUMENTS

| | | | |
|---|---|---|---|
| 4,447,726 A | | 5/1984 | Mudge et al. |
| 4,698,730 A | * | 10/1987 | Sakai et al. ................. 362/311 |
| 4,767,172 A | * | 8/1988 | Nichols et al. ............. 385/146 |
| 5,382,810 A | | 1/1995 | Isaksson |
| 5,485,317 A | | 1/1996 | Perissinotto et al. |
| 5,504,664 A | * | 4/1996 | Ostema ....................... 362/104 |
| 5,608,290 A | * | 3/1997 | Hutchisson et al. .... 315/200 A |
| 5,694,112 A | * | 12/1997 | VannRox et al. ........... 340/472 |
| 5,757,557 A | * | 5/1998 | Medvedev et al. ......... 359/708 |
| 5,929,788 A | * | 7/1999 | Vukosic .................. 340/908.1 |
| 5,985,696 A | * | 11/1999 | Brunner et al. ............. 438/116 |
| 6,033,087 A | | 3/2000 | Shozo et al. |
| 6,035,447 A | * | 3/2000 | Hsia ............................... 2/206 |
| 6,155,699 A | * | 12/2000 | Miller et al. ................ 362/293 |
| 6,260,508 B1 | * | 7/2001 | Morse ......................... 116/211 |
| 6,365,920 B1 | * | 4/2002 | Abramov et al. ............. 257/81 |
| 6,961,190 B1 | | 11/2005 | Tamaoki et al. |
| 2003/0132495 A1 | | 7/2003 | Mills et al. |

FOREIGN PATENT DOCUMENTS

| | | |
|---|---|---|
| EP | 0921568 A2 | 6/1999 |
| JP | 74174/1974 | 6/1974 |
| JP | S54-10754 | 1/1979 |
| JP | 62-18775 | 1/1987 |
| JP | 94659/1987 | 6/1987 |
| JP | S63 4009 | 1/1988 |
| JP | 105365/1988 | 7/1988 |
| JP | 101380/1989 | 7/1989 |
| JP | 05-019705 | 1/1993 |
| JP | 06 013657 | 1/1994 |
| JP | 06 222722 | 8/1994 |
| JP | H7 27011 | 5/1995 |
| JP | 9-70250 | 3/1997 |
| JP | 10-302514 | 11/1998 |
| JP | 11-9171 | 1/1999 |
| JP | 11 026816 | 1/1999 |
| JP | 11-163418 | 6/1999 |

* cited by examiner

FRIGHTENING APPARATUS

BACKGROUND OF THE INVENTION

1. Field of the Invention

The present invention pertains to an application of semiconductor light-emitting elements. In particular, the present invention relates to a frightening apparatus against animals, to prevent damage by animals while maintaining the coexistence and symbiosis of human beings with animals such as mammals or birds.

2. Background Art

"A bird strike" is a term indicating the collision of a bird against to an aircraft. There are about 1000 incidents or bird strikes reported in this country each year. It is said that there is about 500 million yen in damage caused to airlines every year, by engines sucking in a bird and then breaking down etc. The collision of birds with aircraft, or their getting caught up in the engine obviously causes damage to the aircraft, but also, according to foreign reports, can be a cause of aircraft crashes. For example, in the U.S. air force base in U.S. Alaska, in 1995, the group of wild geese collided with a transportation aircraft just after take off, two engines broke, and 24 crew were killed in the accident that followed.

Thus, since most incidents have occurred in the vicinity of airports, such as on take-off runways, it was thought that scarecrow measure against birds (especially eagles etc. with slow movements) which fly near runways, are important against bird strikes, and many trials have been performed. Earlier scarecrow measure against bird strikes involved painting an eyeball mark on the central part of the engine of a passenger plane. This eyeball mark looks like an eyeball, which turns round and round when the engine is operating, and it was anticipated that birds would not approach it.

In addition, on farms, groups of sparrows pick ears of rice in rice fields, and pigeons etc. pick seed scattered in fields, causing serious damage to the crop. In addition, in cities or suburbs, pigeons, shrikes, crows, etc. live in groups, and their excrement adheres to the roof of houses, the veranda of houses, or to washing, and trouble is caused to the comfort of everyday life. Various frightening apparatuses have been proposed against such damage by birds and the excrement of birds. For example, such things as objects with the above-mentioned eyeball pattern attached have been made to hang from a balloon, things have been made to generate explosions, things have been made to generate light, things have been made to generate light and a tone birds dislike, etc. have been attempted.

Furthermore, in order to prevent the entry of stray cats into property, an experiment of arranging water-filled polyethyleneterephthalate (PET) bottles has also been carried out, but the results are regarded as questionable.

Since a semiconductor light-emitting element such as a light emitting diode (LED) converts electric energy directly into light energy, compared with the incandescence lamp such as a halogen lamp, or a fluorescent lamp, the semiconductor light-emitting element has high conversion efficiency and characteristics being that the emission of light is not accompanied with the generation of heat. In an incandescent lamp, because the electric energy is once converted into heat energy, and the light radiation due to the generation of heat is used, the conversion efficiency of an incandescent lamp in light is theoretically low, and the conversion efficiency cannot exceed 1%. Similarly, because electric energy is converted once into electric discharge energy in a fluorescent lamp, the conversion efficiency of the fluorescent lamp is low. On the other hand, in the LED, it is possible to achieve a conversion efficiency of more than 20%, which is about 100 times higher than that of an incandescent lamp or a fluorescent lamp. Furthermore, the semiconductor light-emitting element such as the LED can be considered as having an almost semi permanent life, and there is no problem of flickering such as with the light from the fluorescent lamp.

SUMMARY OF THE INVENTION

As an earlier scarecrow measures against bird strikes, the eyeball mark painted on the central part of the engine of a passenger plane is completely ineffective, as has been made clear by the experience of airlines over more than 15 years. And as for the painting of an eyeball mark, the paint expense for this is also twice the usual amount.

In animals, such as primates and birds, the level of intelligence varies with species. However, while there is a difference in the level of intelligence, each has a corresponding learning capability. Therefore, there is a problem in that even what was once considered a powerful scarecrow for driving off birds will eventually lose its effectiveness with use as birds become used to it. Crows in particular, have excellent observation capabilities, and the effectiveness of a scarecrow device is lost in a short period of time.

Thus, at present, effective frightening apparatus against wild animals is not actually known.

On the other hand, although LED has the outstanding characteristic as above objects, the application of LED is limited to the range extremely restricted displays such as electric signboards, display lamps of the control panel of miscellaneous equipment. This is due to the fact that although the intensity of LED is extremely high, since the light-emitting area of a single LED is a small area of around 1 mm$^2$, sufficient light cannot be produced.

The present invention was made in order to solve above problems. Therefore, an object of the present invention is to provide the frightening apparatus which can effectively prevent animals from flying toward and approaching a scarecrow, so that small animals such as a stray cat, rat, wild animals such as a raccoon dog, wild boar, monkey, deer, bear, fox, and wild birds such as a wild goose, sparrow, crow do not impede the activity and lifestyle of human beings.

Another object of the present invention is to provide a frightening apparatus against other breeds of animals using a light-emitting unit using a sufficiently bright the semiconductor light-emitting element.

Still another object of the present invention is to provide a cheap the frightening apparatus which displays an animation beyond the learning capability of animals with comparatively high intelligence levels, such as birds and monkeys, enabling it to guarantee a scarecrow effect over animals permanently by using a light-emitting unit having a sufficiently bright semiconductor light-emitting element.

In order to achieve above objects, the first aspect of the present invention inheres in a frightening apparatus embracing a bulk-shaped lens and a semiconductor light-emitting element installed in a well-shaped cavity at the backside of the bulk-shaped lens. And, furthermore, it specifies that the outer diameter of a perimeter part of the bulk-shaped lens is less than ten times and more than three times of the inner diameter of the well-shaped cavity. The objects of the frightening apparatus are animals, including mammals such as mice, badgers, monkeys, deer, bears, foxes, and birds such as eagles, sparrows, shrikes, crows, wild geese.

An optical lens medium of the bulk-shaped lens has a top surface, a back surface and a contour surface. A ceiling of the cavity established in the interior of the optical lens medium serves as a first lens surface, a top surface of the optical lens medium serves as a second lens surface, the inside of the cavity serves as a storing cavity of the semiconductor light-emitting element. That is to say, the first lens surface serves as an entrance surface, and the second lens surface serves as an exit surface. Within the term of "bulk-shaped", a bullet-shape, egg-shape, cocoon-shape, or barrel vault-shape can be included. As for the sectional geometry, which is perpendicular to the optical axis, a complete circle, ellipse, triangle, quadrangle, polygon, or other shapes are possible. As for the cross-sectional contour surface of the optical lens medium of the bulk-shaped lens, the surface of a cylinder or prism, or the surface may have a taper against the optical axis.

The optical lens medium of the bulk-shaped lens is required to be of a material transparent to the wavelength of light, because the optical lens medium serves as the optical transmission medium, connecting the exit surface to the entrance surface. As "a material transparent " transparent resins (transparent plastic materials) such as an acryl resin, or various kinds of glass materials such as quartz glass, soda-lime glass, borosilicate glass, or lead glass can be employed. Or, crystalline materials such as zinc oxide (ZnO), zinc sulphide (ZnS), silicon carbide (SiC) may be used. In addition, even a material having pliability, flexibility or elasticity, such as a transparent elastomer can be employed.

As "the semiconductor light-emitting element", an element that does not generate remarkable heat at the luminescence operation, such as an LED or semiconductor laser, are desirable. If "the semiconductor light-emitting element" is used, when it is installed in the cavity (the storing cavity) of the bulk-shaped lens according to the first aspect of present invention, no thermal effect is conveyed to the bulk-shaped lens by the heat action. Or, desired illumination intensity can be easily achieved without requiring a large number of semiconductor light-emitting elements. The illumination intensity of the present invention cannot be achieved by the optic system using earlier optical lenses. That is to say, an illumination intensity that cannot be predicted from earlier technical common sense can be achieved here, using a simple and compact configuration. The equivalent function of the bulk-shaped lens of the present invention cannot be implemented by earlier thin optical lenses such as an earlier "double convex lens", "planoconvex lens", "meniscus convex lens", "double concave lens", "planoconcave lens", "meniscus concave lens" etc. Or, the equivalent function would only become possible by using a large-scale earlier thin optical lens of infinite diameter. In this way, sufficient light to scare off wild animals can be produced.

It is preferable that the outer diameter of the perimeter part of the optical lens medium is less than ten times and more than three times the inner diameter of the storing cavity (the well-shaped cavity), according to the first aspect of the present invention. Increasing the ratio between the outer diameter and the inner diameter is equivalent to increasing the relative wall thickness of a sidewall portion of the storing cavity of the optical lens medium (the well-shaped cavity). By increasing the relative wall thickness of the sidewall portion, without using the configuration established by reflection coating on a peripheral surface of taper, such as for example the front optical lens disclosed at Japanese Utility Model Laid-Open No. 62-92504, the stray light component of a light source can be effectively condensed. By "a stray light component", the divergence characteristic of the output light of a light source is meant, the component of output light incident on surfaces other than a ceiling of a storing cavity (the main entrance surface). Because it is not essential to use the reflecting mirror at the perimeter of the optical lens medium, a protruding portion or a groove at the perimeter part can be used for holding the bulk-shaped lens, and for driving/controlling of its location. It is to say, even if other form and structures such as a protruding portion or a groove at the perimeter of the optical lens medium are added, this does not have fatal influence on condensing characteristic of the lens.

The second aspect of the present invention inheres in a frightening apparatus, encompassing a bulk-shaped lens, the bulk-shaped lens being disposed at the tip vicinity of a rotating body, and a semiconductor light-emitting element, being installed in the well-shaped cavity formed at the back surface side of the bulk-shaped lens.

Here, "the rotating body" corresponds to the spinner of a propeller, a spinner cover, or the fan braid of a turbofan engine in the case of an aircraft. The shaft of windmill-type bodies other than aircraft are also included, provided they rotate around a predetermined axis of rotation. "A bulk shape" refers to a bullet-shape, egg-shape, cocoon-shape, and barrel vault-shape, as stated in the first aspect of the present invention. The bulk-shaped lenses has a ceiling of a well-shaped cavity for an entrance surface, and has at least an optical transmission medium connecting an exit surface (a hemispheric top surface) and the entrance surface. In other words, the well-shaped cavity embraces the entrance surface, and sidewall cylindrically curved, portions, which are continuously formed with the entrance surface. For "the semiconductor light-emitting element", a light source without considerable heat generation action is desirable for low power consumption when emitting-light, such as a LED or a semiconductor laser.

Because a bright highly luminous body emits strong light, bird are startled and do not approach, and bird strikes etc. can be prevented effectively according to the second aspect of the present invention. For the LED, a commercial LED of various configurations can be employed such as a surface mounted disc' type LED, and a resin seal molded LED in a bullet-shape (bullet-shaped) etc. Further, a naked LED chip can be installed in a well-shaped cavity and molded with a resin seal. In particular, if plural LED chips are installed in the cavity of the bulk-shaped lens, an extremely bright light-emitting unit can be achieved. More preferably, a stacked structure can be adopted whereby, the principal face of plural LED chips are stacked vertically. Here, "the principal face" is one of two opposite flat parallel plate surfaces, and excludes a side edge surface. It is to say, "the principal surface" is either the top or the rear surface. Because the plural LED chips are stacked vertically to the principal face, a combined output of all the surfaces can be emitted so as to provide an extremely bright light-emitting unit.

The solid material of miscellaneous transparency mentioned in the first aspect of the present invention can be employed as a material for a bulk-shaped lens. It is preferably made of such as superior quartz materials for abrasion resistance, when used on an aircraft for the purpose of bird strike protection.

The third aspect of the present invention inheres in the frightening apparatus, encompassing a plurality of bulk-shaped lenses, the bulk-shaped lenses being disposed around a predetermined central axis, a plurality of semiconductor light-emitting elements being installed in well-shaped cavities formed at the rear faces of the bulk-shaped lenses so that an animation can be displayed by turning on and off sequentially the light from the semiconductor light-emitting elements.

Here, "the bulk-shaped lens" and "the semiconductor light-emitting element" are already defined in the first aspect of the present invention. "The animation" such as rotating ellipse rings, rotating eyeballs, and rotating multi-radial spirals, is displayed by sequentially turning on and off the semiconductor light-emitting elements, according to the third aspect of the present invention. Therefore, it can be applied to such as a turbofan engine without using the fan braid. Here, it is preferable for a concrete video image to be displayed, because a sense of reality in "the animation" can be achieved. However, "the animation" does not have to be such a concrete video image, and can also preferably be a simple pattern or symbol such as for example a snake marking varying dynamically (necessarily with time), in order to keep costs low. In addition, it is not necessarily the rotation-variance, and the repetition along one direction such as for example movement of wave is also preferable.

Even animals of comparatively high intelligence such as birds or a monkeys will be surprised and do not approach, because the picture moves by turning on and off the highly luminous bodies according to the third aspect of the present invention.

DETAILED DESCRIPTION OF THE INVENTION

Figure 1:
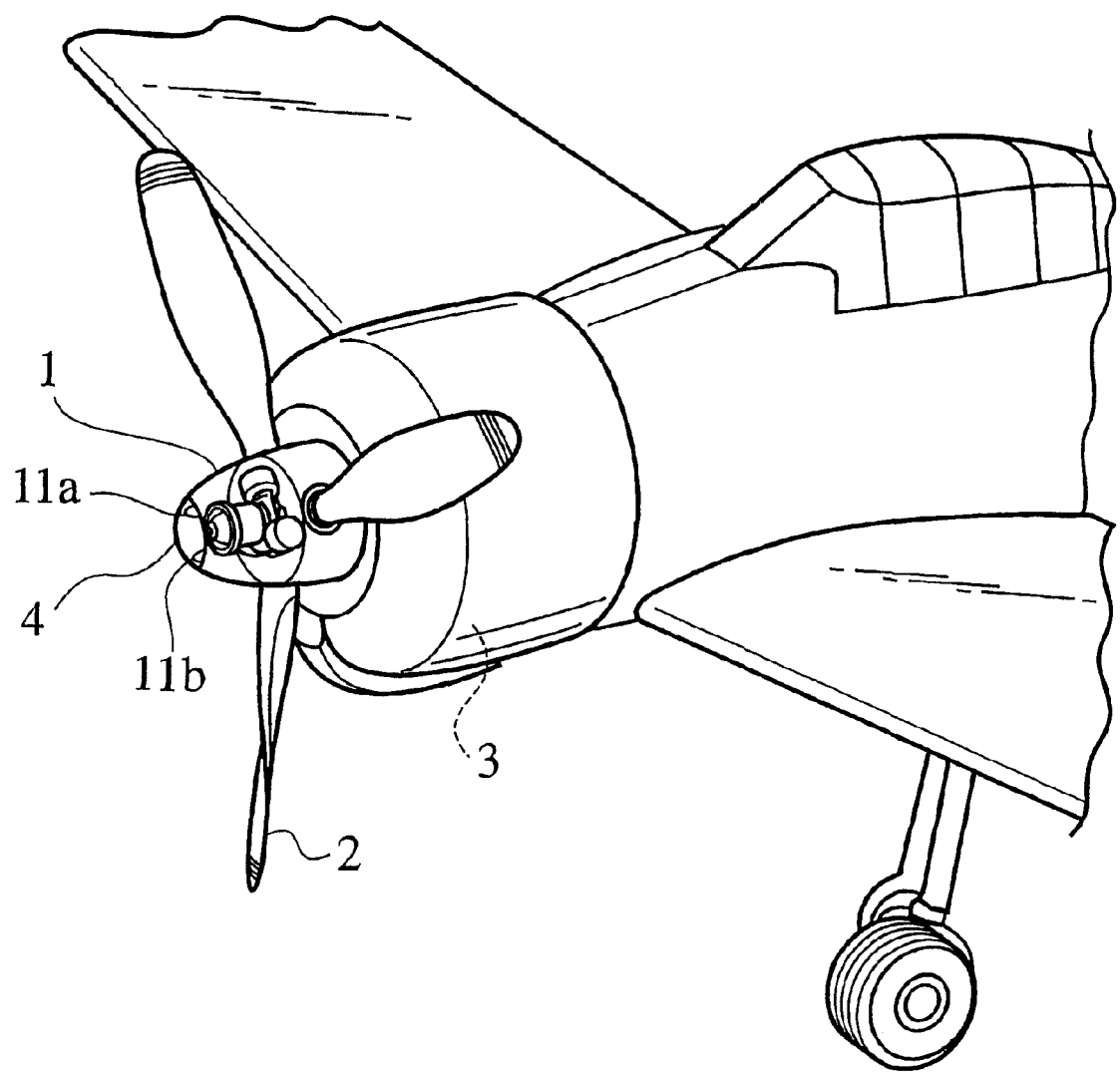
FIG. 1 is a schematic bird's-eye view showing the frightening apparatus according to a first embodiment of the present invention.

First to third embodiments of the present invention will be described with reference to the accompanying drawings. It is to be noted that the same or similar reference numerals are applied to the same or similar parts and elements throughout the drawings. However the drawings are represented schematically, and it will be appreciated that the relationships between the layer thickness and the plane size, the proportions of thickness of each layer are different from the real configuration. Therefore, concrete thickness and size must be determined taking into consideration the following discussion. Further, it will be appreciated that the various drawings are not drawn to scale from one figure to another, and include portions in which the relationship or proportion of sizes are different.

First Embodiment

FIG. 1 is a schematic bird's-eye view showing a structure by which a frightening apparatus of the first embodiment of the present invention is attached to a spinner cover 1 on a propeller 2 of an airplane. As shown in FIG. 1, the frightening apparatus of the first embodiment of the present invention encompasses a bullet-like bulk-shaped lenses attached to the tip vicinity of spinner cover 1, which serves as the rotation body, and semiconductor light-emitting elements installed in a well-shaped cavity disposed at the rear of the bulk-shaped lens. Propeller 2 is driven by engine portion 3. A first light-emitting unit 11a embraces a first bulk-shaped lens and a first semiconductor light-emitting element installed in a cavity of the first bulk-shaped lens. A second light-emitting unit 11b embraces a second bulk-shaped lens and a second semiconductor light-emitting element installed in the cavity of the second bulk-shaped lens. The first light-emitting unit 11a and the second light-emitting unit 11b are formed so as to be able to attach to and detach from the spinner cover 1 as a bird-strike-protection attachment 4. More concretely, it is preferable that the bird-strike-protection attachment 4 is fastened to the spinner cover 1 by such as a bolt not illustrated. Here, the first and the second semiconductor light-emitting element are respectively first and the second LEDs.

Figure 2:
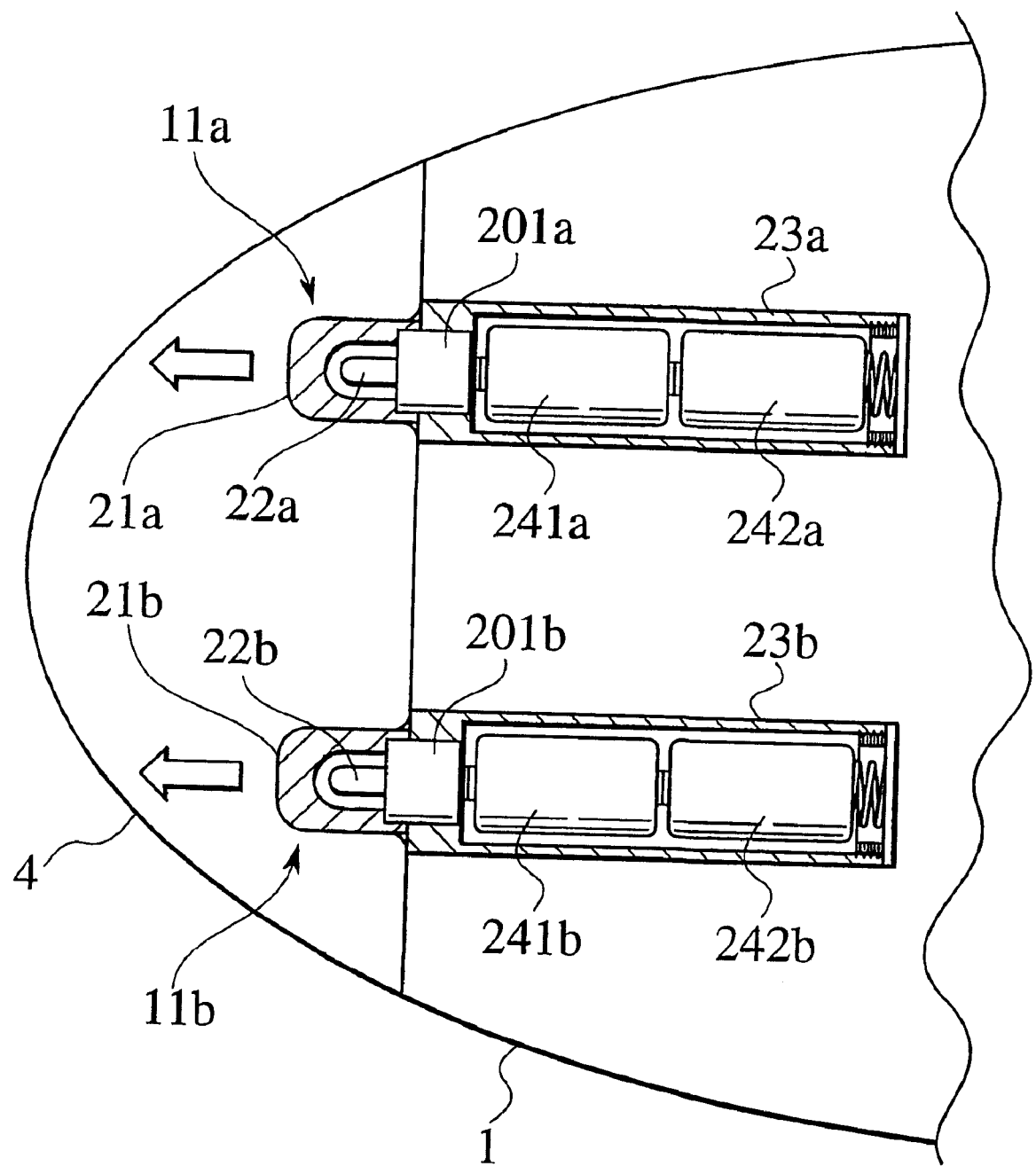
FIG. 2 is a schematic partial cross-sectional view showing details of bird-strike-protection attachment shown in FIG. 1.

FIG. 2 is a schematic partial cross-sectional view showing details of the bird-strike-protection attachment 4 shown in FIG. 1. That is to say, the cross-sectional view shows only the first light-emitting unit 11a and the second-light-emitting unit 11b. The first light-emitting unit 11a has a first LED 22a, and a first bulk-shaped lens 21a having a well-shaped cavity for installing the first LED 22a in the inside. In the same way, the second light-emitting unit 11B has a second LED 22b, and a second bulk-shaped lens 21b having a well-shaped cavity for installing the second LED 22b in the inside. Furthermore, the bird-strike-protection attachment 4 has the battery 241a, 242a activating the first LED 22a, a control circuit controlling power supply from the batteries 241a, 242a, batteries 241b, 242b activating the second LED 22b, another control circuit controlling power supply from the batteries 241b, 242b. These control circuits have semiconductor pressure sensors measuring the altitude of the airplane. Therefore, after a takeoff, when the airplane reaches a specific altitude above the level where birds fly, the lights of the first LED 22a and the second LED 22b are automatically turned off. In addition, it is formed so that when in preparation for landing, the altitude fulls below this specific altitude; the first LED 22a and the second LED 22b are automatically light up. The control circuit is merged in a monolithic semi-conductor IC and is installed inside a base pedestals 201a, 201b. The batteries 241a, 242a are installed in a battery case 23a, and the batteries 241a, 242a are installed in a battery case 23b. An insulation membrane not illustrated, in order to with stand high-speed revolutions fastens these batteries. In addition, a configuration in which a common battery case is disposed on a central axis of the bird-strike-protection attachment 4 can also be used so that a big centrifugal force does not act on the batteries.

The first LED 22a, the second LED 22b, . . . are commercial resin molded LEDs, each of the top surface is formed in a convex-shape having a predetermined curved radius. For example, apart from the top surface of the convex-shape, the resin molded LED has a cylindrical geometry with a diameter (outer diameter) of 2-8 mm$^\Phi$. In addition, the first bulk-shaped lens 11a, the second bulk-shaped lens 11b, . . . have well-shaped concavities which can receive the first LED 22a, the second LED 22b, . . . The sidewall portion of the well-shaped cavity has the cylindrical geometry with diameter (inner diameter) of 2.5-9 mm$^\Phi$ which can receive the resin molded LED. Although its illustration is omitted, between the storing cavities of the first LED 22a, the second LED 22b, . . . , spacers having thickness of around 0.2-0.5 mm or adhesive materials are interposed in order to fix the first LED 22a, the second LED 22b, . . . , and the first bulk-shaped lens 11a, the second bulk-shaped lens 11b, . . . It is preferable that the spacers or the adhesives are disposed so as to exclude the main luminescence portions of the first LED 22a, the first LED 22b, . . . For example, it is preferable that the diameter (outer diameter) of the cylindrical geometry portion of the first bulk-shaped lens 11a, the second bulk-shaped lens 11b, . . . are chosen as 6-60 mm$^{100}$. Because a top of each of the first bulk-shaped lens 11a, the second bulk-shaped lens 11b, . . . is formed in a convex-shape having a predetermined curved radius, the first bulk-shaped lens 11a, the second bulk-shaped lens 11b, . . . efficiently condense lights emitted from the first LED 22a, the second LED 22b, . . . and make it possible to emit these lights outward.

In general, with a visible light LED (resin molded LED), light emitted aside from the convex surface of the top surface of the resin seal does not contribute to the light beam scaring animals, because it becomes so-called stray light component. However, because the first LED 22a, the second LED 22b, . . . are nearly completely encapsulated in the well-shaped cavity of the first LED 22a, the second LED 22b, . . . , it becomes possible for the stray light component to contribute significantly to the light beam scaring animals. That is to say, the inner wall portions other than the incidence surface (the ceiling) of the well-shaped cavity, can serve as the effective incidence surface for the light. In addition, components of the light reflected back at each interface repeat multiple reflections between the first LED 22a, the second LED 22b, . . . and the inner walls of the well-shaped concavities. According to the optic system of known optical lenses, these stray light components cannot be extracted so as to contribute to light beam. However, here, these stray light components can finally contribute to the light beam, because these stray light components are confined inside the well-shaped concavities, according to the first embodiment of the present invention. Consequently, it becomes possible to extract the potential light energy from the LED chip, with extraction efficiency approximately the same as the internal quantum efficiency, without being dependent on the geometry of the resin seal or the reflection component of the mutual optic system. In this way, enough light flux to surprise wild animals is obtained without requiring a large number of commercial resin molded LEDs, and a desired illumination intensity can easily be achieved, according to the configuration of optics of the first embodiment of the present invention. The illumination intensities achieved are impossible according to an earlier known optic system of optical lenses of the same geometric size.

The battery case 23a, the battery case 23b, . . . are implemented by pipe-shaped hollow cylinders configured to install the battery 241a, the battery 242a, the battery 241b, the battery 242b, . . . or implemented by similar geometry of the pipe-shaped hollow cylinder. The battery case 23a, the battery case 23b, . . . can be made of such material as stainless steel, aluminum alloy, acryl resin, or plastics. As shown in FIG. 2, the first LED 22a, the second LED 22b, . . . are mounted on susceptors (die pads) disposed on a base pedestal (stem) 201a, a base pedestal (a stem) 201b, . . . The base pedestal (stem) 201a, the base pedestal (stem) 201b, . . . can be made of insulators such as ceramics covered with metals such as stainless steel, brass or copper. The base pedestal (stem) 201a, the base pedestal (stem) 201b, . . . can be formed of the same materials as the first LED 22a, the second LED 22b, . . . so that they become parts of the first LED 22a, the second LED 22b, . . . In addition, in FIG. 2, although the stepped configurations are shown between the diameters of the first LED 22a, the second LED 22b, . . . and the diameters of the base pedestal (stem) 201a, the base pedestal (stem) 201b, . . . , the diameters of the first LED 22a, the second LED 22b, . . . and the diameters of the base pedestal (stem) 201a, the base pedestal (stem) 201b, . . . can have a same value so that the steps between them vanish.

In addition, for the first LED 22a, the second LED 22b, . . . to implement the bird-strike-protection attachment 4 of the first embodiment of the present invention, LEDs of various colors (wavelengths) can be employed. In particular, it is preferable to choose a specific color to warn or hated by wild animals.

As shown FIG. 2, the battery 241a, the battery 242a, the battery 241b, the battery 242b, . . . in order to improve the functionality of the bird-strike-protection attachment 4, and to achieve moderate illumination intensity and movement time, it is possible to suitably elect from such as AA to AAAA size dry cells. Or, such as a lithium battery or a manganese lithium battery of a disk type can also be employed. A changeable small size battery of another kind or an exclusive battery is also possible.

The bird-strike-protection attachment 4 implemented in this way according to the first embodiment of the present invention, has the first bulk-shaped lens 11a, the second bulk-shaped lens 11b, . . . , which condense lights from the first LED 22a, the second LED 22b, . . . with high efficiency, and provide enough brightness and illumination intensities to scare away wild animals. Further, by the bird-strike-protection attachment 4 using the first LED 22a, the second LED 22b, . . . , the continuous lighting time can be lengthened. For example, it can have several tens times to several hundreds times of lighting duration when compared with the case where an incandescent lamp is used. In addition, the bird-strike-protection attachment 4 has a simple structure, which can simplify fabrication processes, and can reduce a production cost.

Figure 3:
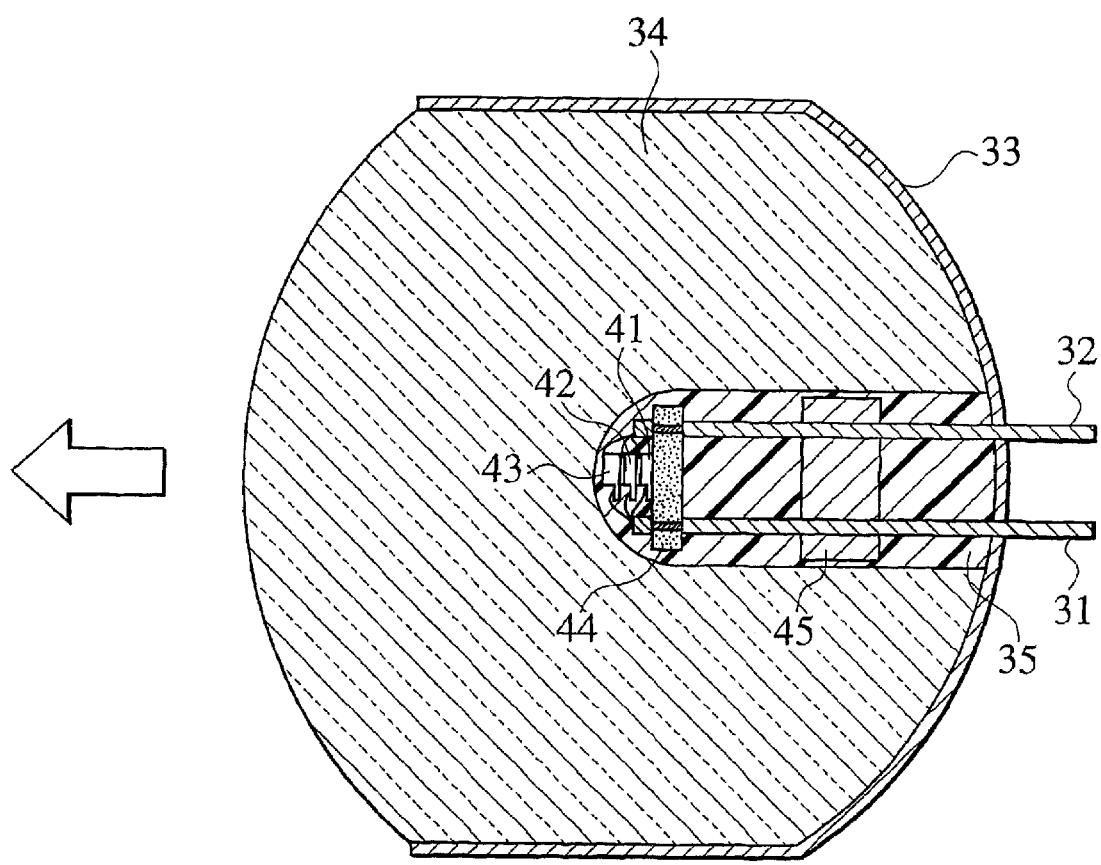
FIG. 3 is a schematic cross-sectional view showing the light-emitting unit according to the first embodiment of the present invention.

An insulating sapphire is used as an epitaxial growth substrate for gallium nitride (GaN) based semiconductor material. In an LED using of such an insulating substrate, the anode and cathode electrodes is extracted together from the front surface side of the epitaxial growth layer. In addition, because this sapphire substrate is transparent to the wavelength of a blue LED, if the design of predetermined optics such as using material transparent at the package, and mounting the blue LED on the material transparent, luminescence from blue LED can be extracted to the rear surface direction of the substrate. In this way, as shown in FIG. 3, it is preferable to arrange a back mirror 33 at the rear surface of the bullet-like bulk-shaped lens 34. In FIG. 3, although the back mirror 33 almost entirely covers the contour surface of the bullet-like bulk-shaped lens 34, only a part of the contour surface of the bullet-like bulk-shaped lens 34 may be covered, or the formation of the back mirror on the contour surface may be omitted. Back mirror 33 may be formed by shaping the metal such as Al, brass, stainless steel using such as lathe and milling machine to the geometry shown in FIG. 3, or molded by press working machines, and the surface is polished, afterwards. Furthermore, it is preferred, if nickel (Ni) plating and gold (Au) plating are provided to the surface so as to improve reflectivity. As a low cost and simple method, a configuration in which a thin metallic film of high reflectivity such as Al thin film is bonded to the surface can be employed. Or, a configuration in which thermoplastic may be formed into the geometry shown in FIG. 3, by extrusion or injection molding, and high reflectivity a thin metallic film such as the Al foil or high reflectivity dielectric multi-layer film may be deposited on the surface by vacuum evaporation or sputtering, or even a configuration in which high reflectivity polyester white film is adhesively bonded on the surface can be employed. Furthermore, a configuration in which the high reflectivity a thin metallic film or dielectric multi-layer film is directly deposited to the rear surface of the bullet-like bulk-shaped lens 34, by vacuum evaporation or sputtering, or the configuration in which composite films embracing these films are deposited on the surface can be employed.

Figure 4:
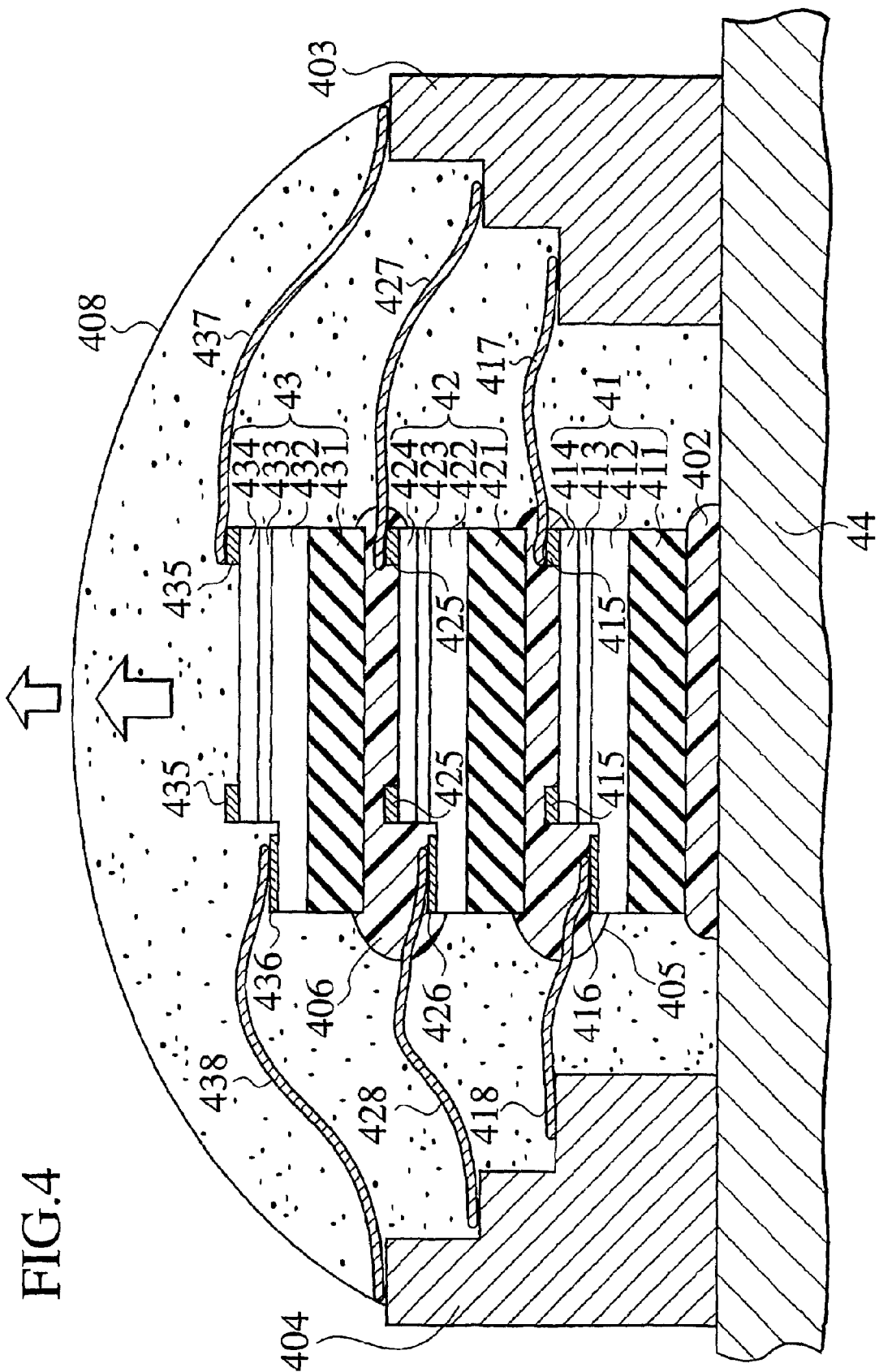
FIG. 4 is a schematic cross-sectional view showing a detail of FIG. 3.

Plural diode chips 41, 42, 43, . . . are vertically stacked in FIG. 3, so that plural optical axes are aligned along a single line. FIG. 4 shows in detail the stacked configuration embracing plural diode chips 41, 42, 43, . . . Three stacked layers are shown in the drawing for simplification, but multi-level structure more than four levels can be adopted, of course. In FIG. 4, the first level diode chip (the first level LED) 41 encompasses, an n-type semiconductor layer 412, an active layer 413, and a p-type semiconductor layer 414 stacked on the sapphire substrate 411. The sapphire substrate 411 is fixed to a susceptor 44 (cf. FIG. 3) by adhesives 402. An anode electrode 415 can be formed on the entire surface of the top face of the p-type semiconductor layer 414 as a transparent electrode. It is concretely preferable that a central portion of the anode electrode 415 may be made of a transparent electrode layer to the luminescence from the active layer 413. A frame-shaped peripheral portion of the anode electrode 415 is made of a relatively thick gold (Au) film having the thickness of 0.5 μm-2 μm level for bonding. A cathode electrode 416 is not required to be transparent, in particular. Tape-automated bonding (TAB) lead (beam lead) 417 made of copper (Cu) foil is connected to the frame-shaped peripheral portion of the anode electrode 415. TAB lead (beam lead) 418 made of the copper foil is also connected to the cathode electrode 416. A second level diode chip (the second level LED) 42 encompasses, an n-type semiconductor layer 422, an active layer 423, and a p-type semiconductor layer 424 stacked on the sapphire substrate 421. The sapphire substrate 421 is fixed on the first level diode chip 41 by transparent adhesives 405. A central portion of the anode electrode 425 is made of a transparent electrode layer to the luminescence from the active layer 423, a frame-shaped peripheral portion of the anode electrode 425 is made of a relatively thick gold (Au) film having a thickness of around 0.5 μm-2 μm for bonding. A cathode electrode 426 is not required to be transparent, in particular. TAB lead (beam lead) 427 made of copper (Cu) foil is connected to the frame-shaped peripheral portion of the anode electrode 425. TAB lead (beam lead) 428 made of the copper foil is also connected to the cathode electrode 426. Likewise, a third level diode chip (the third level LED) 43 encompasses, an n-type semiconductor layer 432, an active layer 433, and a p-type semiconductor layer 434 stacked on the sapphire substrate 431. The sapphire substrate 431 is fixed on the second level diode chip 42 by a transparent adhesive 406. A central portion of the anode electrode 435 is made of a transparent electrode layer to the luminescence from the active layer 433, a frame-shaped peripheral portion of the anode electrode 435 is made of a relatively thick gold (Au) film having the thickness of 0.5 μm-2 μm level for bonding. A cathode electrode 436 is not required to be transparent. TAB lead (beam lead) 437 made of copper (Cu) foil is connected to the frame-shaped peripheral portion of the anode electrode 435. TAB lead (beam lead) 438 made of the copper foil is also connected to the cathode electrode 436. For joints between TAB leads (beam leads) 417, 427, 437, 418, 428, 438 and bonding pats 415, 425, 435, 416, 426, 436, we can use the techniques usually used as TAB bonding techniques such as thermo compression bonding, ultrasonic bonding, gold (Au) bump joints, solder joints. In addition, TAB leads (beam leads) 417, 427, 437 are connected to a terminal 403 by electrically conductive adhesives or solders etc. TAB leads (beam leads) 418, 428, 438 are connected to a terminal 404 by electrically conductive adhesives or solders etc. A resin seal 408 molds plural diode chips 41, 42, 43.

The terminal 403 shown in FIG. 4 is connected to the second pin 32 shown in FIG. 3, and the terminal 404 shown in FIG. 4 is connected to the first pin 31 shown in FIG. 3. Terminal 403 and terminal 404 are drawn to the outside from the through holes formed in the back mirror 33 through a strengthening member 45. If the resin 35 filled in the cavity of the bulk-shaped lens 34 is made of material transparent to luminescence from plural diode chips 41, 42, 43, the lights can propagate to the rear surface direction (FIG. 3, right direction). Light emitted from the plural diode chips 41, 42, 43 to the right direction (rear surface side direction) is reflected back at the back mirror 33, and is output in a leftward direction from the front surfaces of plural diode chips 41, 42, 43. After all, light emitted from the plural diode chips 41, 42, 43 to the right direction (rear surface side direction) merges with the light propagating in a front surface direction (FIG. 3, left direction), and predetermined divergence angle is provided by the exit surface. In this way, in the fourth embodiment of the present invention, plural diode chips 41, 42, 43 are confined nearly completely in the cavity of bulk-shaped lens 34, and the back mirror 33 is arranged at the rear face of bulk-shaped lens 34. Because of this, including stray light components, all light is emitted finally from the front surface, serving as the luminescence surface, so that it can be propagated along approximately same optical axis. Therefore, all luminescence components emitted from diodes chips 41, 42, 43 in various directions effectively collimated so that they become a light to repulse birds.

Plural diode chips 41, 42, 43, . . . are not required to be LED chips of the same semiconductor material. That is to say, various kinds and configurations can be employed as the plural diode chips 41, 42, 43, . . . For example, as plural diode chips 41, 42, 43, if three pieces of LED chips including the red (R), green (G) and blue (B) chips are stacked vertically, as a whole, a wavelength spectrum of an output light can be adjusted to the color that the animals which are the target dislike the most. In the case of a three pieces of LED chips of RGB, as the red (R) LED chip, $Al_xGa_{1-x}As$, as the green (G) LED chip, $Al_xGa_yIn_{1-x-y}P$ or GaP and as blue (B) LED chip, $In_xGa_{1-x}N$ or ZnSe can be employed. In this case, $Al_xGa_{1-x}As$, $Al_xGa_yIn_{1-x-y}P$, GaP do not require the sapphire substrate.

Or ternary, quaternary, quinary, . . . compound semiconductor mixed crystal are chosen as materials for plural diode chips 41, 42, 43, . . . , in which mole factions may be changed. For example, if we choose plural diode chips 41, 42, 43, . . . made of $In_xAl_yGa_{1-x-y}N$, changing each mole fractions, we can emit light in a green (G)-blue (B) spectral range. In correspondence with a three LED chips of RGB, if it derives a total of six pins, or holds out four external pins as one electrode (earth electrode) in common, it can apply each bias separately to three LED chips of RGB. As a result, color can be chosen freely. For example, a tone of color that resembles color of eyes of Raptores can be shown. Birds have superior color discrimination mechanism to human beings and four kinds of cone materials (cock red/green/blue/purple) were reportedly extracted from the outer cone of a cock. Therefore, in correspondence with the superior color discrimination mechanism of birds, it is preferable that various colors are expressed by adjusting the bias of the three LED chips, manifesting the colors of RGB.

Furthermore, although there is a disadvantage in that an optical axis may disperse, three triple-level-stacks may be disposed closely in the quasi-planar topology, each of the triple-level-stacks laminating three diodes chips vertically. In this case brightness of 3*3=9 times can be obtained. If five triple-level-stacks, each having three level laminated chips are arranged in the quasi-planar topology, brightness of 3*5=15 times can be obtained. If plural multi-level-stacks are disposed closely, potent output can be obtained in a state to be nearly a point light source.

Furthermore, although it may have a disadvantage that optical axis may disperse, it is preferable to dispose closely three LED chips, manifesting the colors of RGB respectively, in the quasi-planar topology, instead of the stacked structure, because it becomes possible to adjust colors. As a result, based on rule of thumb, the light can be adjusted to the specific color being hated extremely by an intended animal so as to increase the scarecrow effect. That is to say, it is preferable that bias applied to each chip is so controlled that output color is adjusted. In addition, if an intended animal has learned and the scarecrow effect is decreased, we can maintain the scarecrow effect, by changing bias so that the color is readjusted into another hated color.

Second Embodiment

In the first embodiment of the present invention, a case of attaching the frightening apparatus of the present invention to a rotating body was explained, but if the equipment has no rotating body, the following is also possible.

Figure 5A:
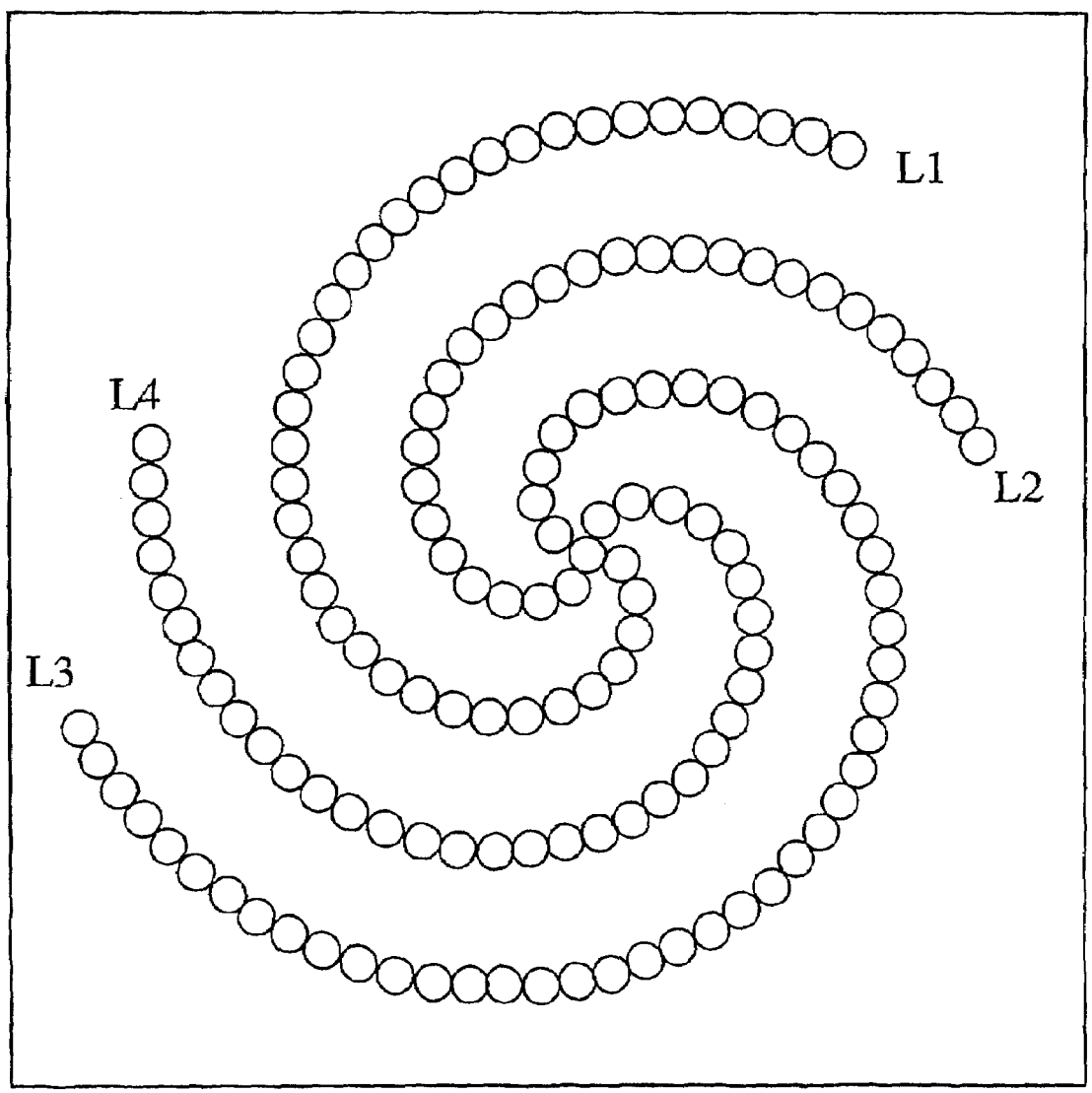
FIG. 5A is a schematic plane view showing the frightening apparatus according to a second embodiment of the present invention.
Figure 5B:
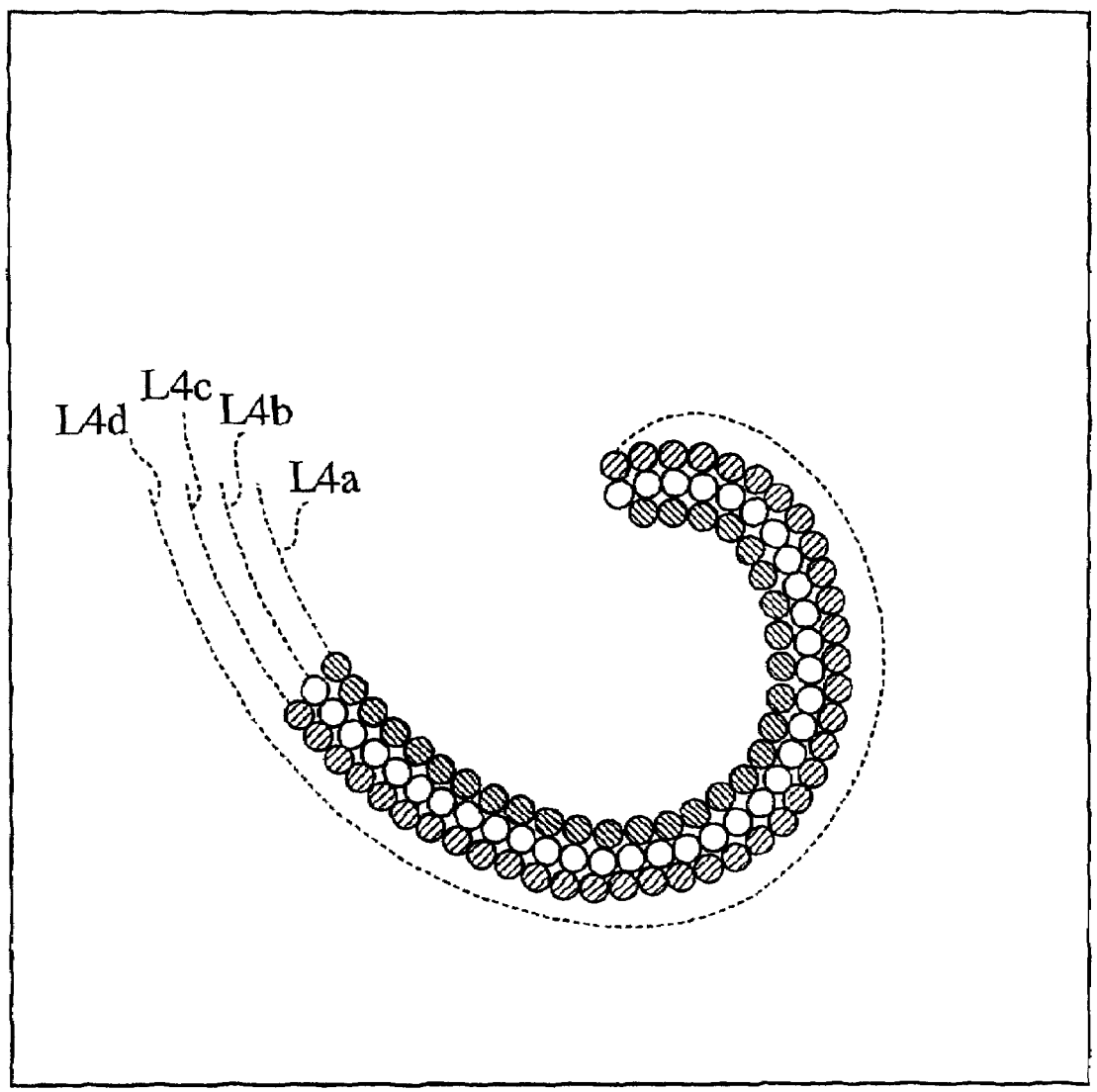
FIG. 5B is a plane view showing a time change of brightness, regarding a specific spiral of FIG. 5A.

In the frightening apparatus of first embodiment of the present invention, bullet-like bulk-shaped lenses are disposed around a predetermined central axis, and plural LEDs are installed in the well-shaped cavity at the backside of the bulk-shaped lens. And, for example, it is preferable that turning on and off plural LEDs sequentially, along the clockwise or counter clockwise direction. The direction of either clockwise or counter clockwise is chosen depending on which target animals such as birds hate the most. In this way, an animation can be displayed by turning on and off the semiconductor light-emitting element sequentially electrically, as in this embodiment, so that animals can be effectively surprised. It is preferable to employ the animation topology such as the rotating eyeball or the multi-radial spirals, as shown in FIG. 5A. Four radial spirals L1, L2, L3, L4 are shown in FIG. 5A, but of course the number of radial spirals can be chosen optionally. Each of radial spirals L1, L2, L3, L4 is manifested by a sequence of plural bullet-like bulk-shaped lenses, and plural LEDs installed in the well-shaped cavity disposed at the backside of the bulk-shaped lens. In FIG. 5A, only bright light-emitting units are shown as the radial spirals L1, L2, L3, L4, but a plurality of light-emitting units are disposed in the shape of a dot matrix on the entire surface, actually. FIG. 5B shows a transitional change of spiral L4 in FIG. 5A. That is to say, as the LEDs installed in the bullet-like bulk-shaped lens aligned along the radial spirals L4a, L4b, L4c, L4d, . . . , turn on sequentially with time, the bright radial spirals L4a, L4b, L4c, L4d, . . . , move sequentially with time, and they converge into the spiral L3. Similarly, bright spiral L3 moves sequentially with time, and converges into the spiral L2. Otherwise, the order of turning on the LEDs can be changed absolutely to opposite direction.

It is preferable to choose the shape and color of the eyeball of Raptores for the animation, in particular. The specific color can be determined in selecting an LED material or by adjustment of the applied voltages to respective RGB LED chips. That is to say, for the well-shaped cavity in which three LED chips of RGB are installed as shown in FIG. 3 and FIG. 4, various colors are expressed by adjusting the bias of respective LED chips. The method of electrically turning on and off the semiconductor light-emitting elements sequentially can be applied to such as a turbojet engine without the use of rotating fan blade. In addition, even in the case of turbofan engine, a front (tip) of a cowling of the engine (cover of the engine) can be used, and ring-shaped animation may be shown on the front of cowling. In the methodology of electrically turning on and off the semiconductor light-emitting elements sequentially, being adopted to the cowling of the engine, there is no need to be supplied with the battery, but the electric power can be supplied with wiring from the electric power system of the airplane. In addition, although not to the engine part, the frightening apparatus of the second embodiment of the present invention may be adopted to fuselage portion of the airplane.

Furthermore, the animation shown in FIG. 5A may be installed as scarecrows of rice fields, and may also be used in signboards or on walls of private houses. When it is used such as a sparrow scarecrow for rice fields, an acoustic sensor responsive to the cry of sparrows can be installed, and it may illuminate for a fixed duration in response to the cry of sparrows. Or, it may continuously operate, but raise the intensity in response to the cry of sparrows, and it may be configured to make the movement speed fasten in response to the cry of sparrows. Furthermore, an illumination intensity sensor for measuring daylight can be installed, so that it may light up only in the daytime. Acoustic sensor and illumination intensity sensor may be combined.

Furthermore, dots each made of three color light-emitting units may be arranged in the shape of a dot matrix so that an image display panel is formed, and it may display peculiar and strange animations such as Raptores, "black devil" or snake model. And, by cooperating with sensor functions stated in the example above, and by displaying the animation to animals having high learning capability, it can prevent animals becoming accustomed to the pattern. In order to display more detailed animation, a microprocessor can be installed, and can be connected to video equipment. Because the dot matrix using the bulk-shaped lens of the present invention reduces the number of the LEDs necessary for the dot matrix configuration, and provides enough brightness, an image display panel which is low cost can be provided. If the frightening apparatus according to the second embodiment of the present invention is attached to the fuselage portion of the airplane, especially at a particular body tip region under the cockpit, because it has space, an animation with a high level of reality can be expressed. If an eyeball marking is expressed on either side of the body tip region around the cockpit, and it looks like very large-sized Raptores, effectiveness is very high.

Third Embodiment

Figure 6:
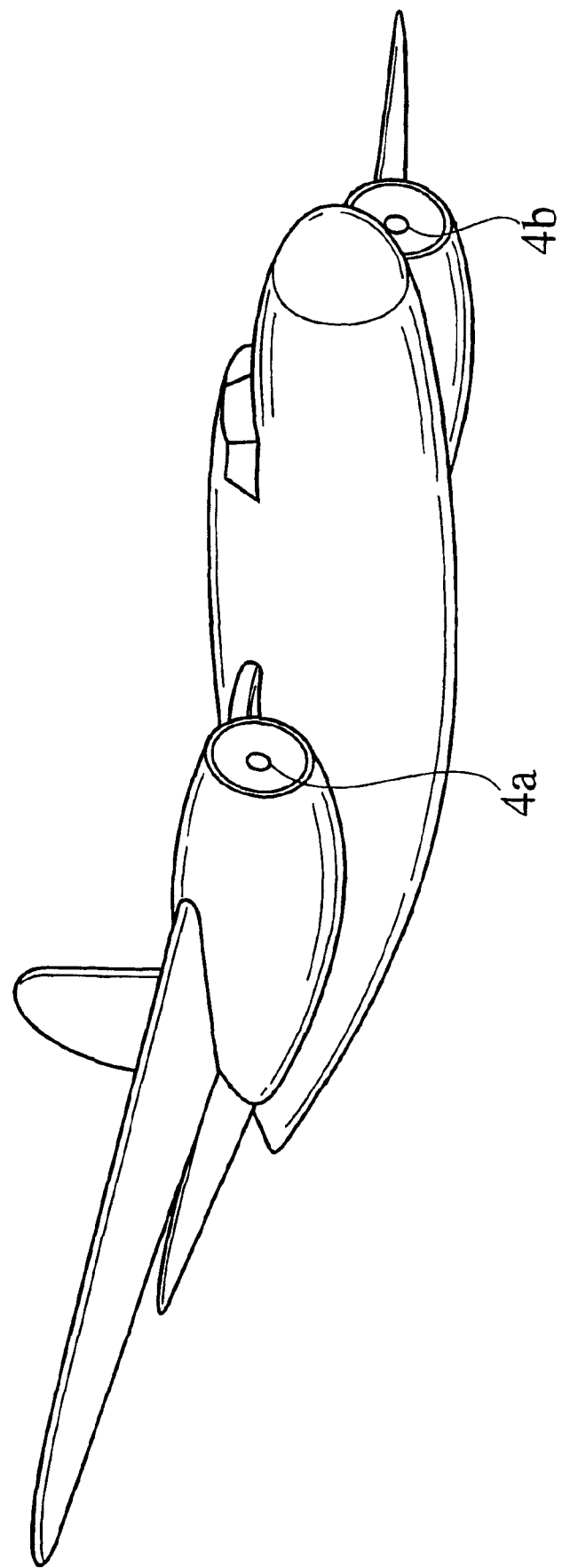
FIG. 6 is a schematic bird's-eye view showing the frightening apparatus according to a third embodiment of the present invention.

In the first embodiment of the present invention, a case of attaching the bird-strike-protection attachment 4 to the spinner cover 1 was shown, but this is only an example, and the frightening apparatus of the present invention can be attached to various rotating bodies. For example, as the rotating body, the bird-strike-protection attachment 4 can be directly attached to the propeller of a spinner. In addition, as shown in FIG. 6, the bird-strike-protection attachments 4a, 4b may be attached at fan blades of respective turbofan engines. In addition, as well as aircrafts, the bird-strike-protection attachment 4 can be attached to a shaft of windmill.

Figure 7A:
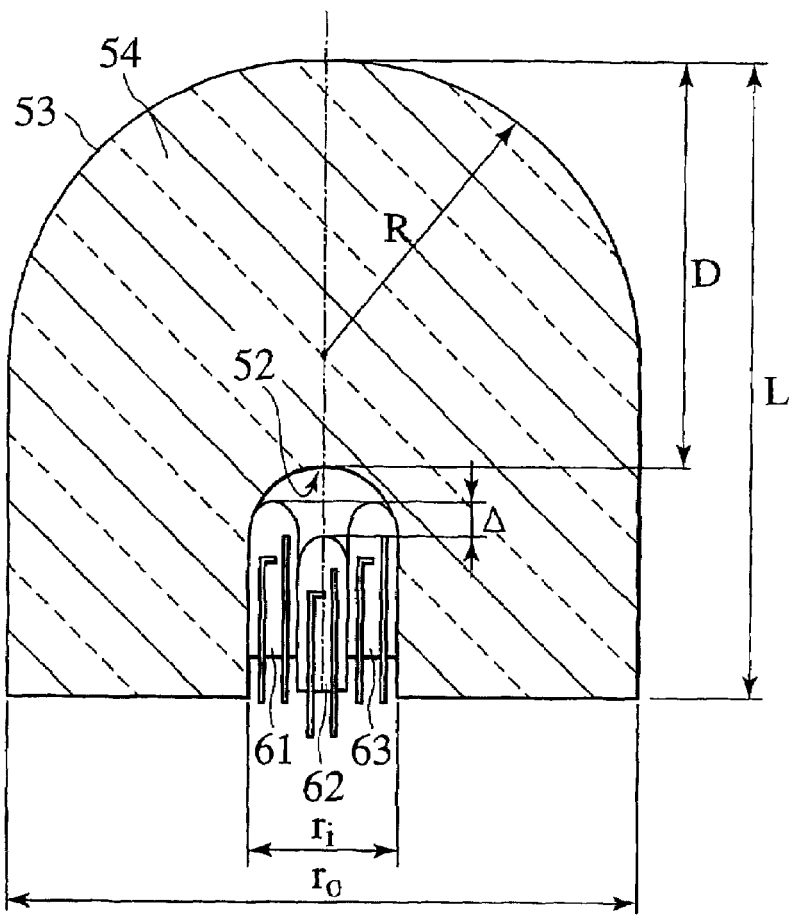
FIG. 7A is a schematic cross-sectional view showing the light-emitting unit according to the third embodiment of the present invention.

FIG. 7A is a schematic cross-sectional view showing a configuration of the light-emitting unit used in the bird-strike-protection attachments 4a, 4b. As shown in FIG. 7A, the light-emitting unit of the third embodiment of the present invention is formed of at least five resin molded LEDs 61, 62, 63, . . . , 65 emitting lights each having predetermined wavelength and a bulk-shaped lens 54 encapsulating nearly completely the resin molded LEDs 61, 62, 63, . . . , 65. And, the bulk-shaped lens 54 embraces a bulk shaped (bullet-shape) lens medium 54 identified by top surface 53, backside and contour surfaces and well-shaped cavity 51 implemented in the inside of lens medium 54, dug to top surface 53 from the backside surface. A ceiling of the cavity 51 disposed in the interior of lens medium 54 serves as a first lens surface 52, the top surface of the lens medium 54 serves as a second lens surface 53, the inside of the cavity serves as a storing cavity 51 of the LEDs 61, 62, 63, . . . , 65.

The first lens surface 52 serves as an entrance surface 52 identified by the first curved surface. The storing cavity 51 embraces a ceiling 52 identified by a first curved surface and a sidewall portion, configured to form the cavity continuous with the ceiling 52. The light incident from the entrance surface 52 is output from the exit surface 53, or the second lens surface 53 identified by the second curved surface. The portion connecting the entrance surface 52 and the exit surface 53 of lens medium 54 should be made of a material transparent to wavelength of light emitted from the resin molded LEDs 61, 62, 63, . . . , 65, because the portion serves as an optical transmission medium.

Figure 7B:
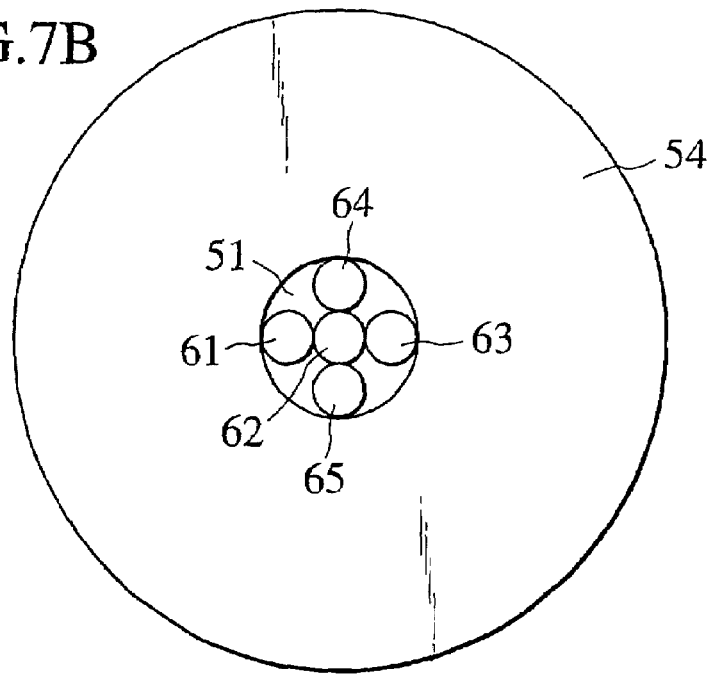
FIG. 7B is a rear view of the light-emitting unit in FIG. 7A.

Each of the LEDs 61, 62, 63, . . . , 65 shown in FIG. 7A is an LED encompassing a first pin, a susceptor connected to the first pin so as to form a single body, an LED chip mounted on the susceptor, molding resin configured to encapsulate the LED chip, and a second pin opposing to the first pin. Each top surface of a main luminescence portion of this LEDs 61, 62, 63, . . . , 65 has a convex surface as shown in FIG. 7A. For example, apart from the convex surface portion, each of the LEDs 61, 62, 63, . . . , 65 has a cylindrical geometry of diameter (outer diameter) $2r_{LED}$=2-3 mm$^\Phi$. As shown in FIG. 7B, central LED 62 is surrounded in symmetry by four LEDs 61, 63, . . . , 65. As for the sidewall region of the storing cavity 51 of the bulk-shaped lens 54, the storing cavity 51 has a cylindrical geometry of diameter (inner diameter) $2r_1$=7.0-10 mm$^\Phi$ so as to receive a main luminescence portion of five LEDs 61, 62, 63, . . . , 65. Although not illustrated, between the LEDs 61, 62, 63, . . . , 65 and the storing cavity 51 in the bulk-shaped lens 54, a spacer of thickness around 0.25-0.5 mm may be interposed in order to fix the LEDs 61, 62, 63, . . . , 65 to the bulk-shaped lens 54. That is to say, a value of three times the outer diameter $2r_{LED}$ of the LEDs 61, 62, 63, . . . 65 is approximately same as the inner diameter $2r_1$ of the storing cavity 51, and the outer diameter $2r_{LED}$ of the LEDs 61, 62, 63, . . . , 65 is set slightly smaller than the inner diameter $2r_1$. Bulk-shaped lens 54 has an almost cylindrical geometry, similar to the geometry of the LEDs 61, 62, 63, . . . , 65, apart from the top surface having the exit surface, identified by the convex-shaped second curved surface. Diameter (outer diameter) $2r_0$ of cylindrical geometry portion of this bulk-shaped lens 54 is 21-100 mm$^\Phi$. The diameter (the outer diameter) $2r_0$ of the bulk-shaped lens 54 can be chosen depending on the purpose of use of the light-emitting units of the third embodiment of the present invention. Therefore, it can be less than 21 mm$^\Phi$, and more than 100 mm$^\Phi$. However, in order to increase the condensing efficiency, it is preferable to satisfy the relationship:

$$10r_1 > r_0 > 3r_1 \qquad \ldots (1)$$

Diameter (outer diameter) $2r_0$ of the bulk-shaped lens 54 can be more than ten times of the inner diameter $2r_1$ of the storing cavity 51, and the large dimensional bulk-shaped lens of the present invention can operate similarly, but this is unfavorable for the purpose of miniaturization, because it is larger than the size required.

Generally, light appearing from regions apart from the convex surface of the resin mold of LEDs 61, 62, 63, . . . , 65 do not contribute to the lighting, because it becomes a so-called stray light component. However, in the geometric configuration according to the third embodiment of the present invention, in which the geometry satisfies the Equation (1), because the LEDs 61, 62, 63, . . . , 65 are nearly completely encapsulated in the storing cavity 51 of the bulk-shaped lens 54, it becomes possible for the stray light component to contribute significantly to lighting. That is to say, the inner wall portion of the storing cavity 51 apart from the entrance surface (the ceiling) 52, identified by the first curved surface, can serve as the effective entrance surface for the light. In addition, components of light reflected back from each interface repeat multiple reflections between the LEDs 61, 62, 63, . . . , 65 and the storing cavity 51 in the bulk-shaped lens 54 so that it becomes the stray light components. By an optic system of the earlier known optical lenses, these stray light components cannot be extracted so as to contribute to effective lighting. However, these stray light components can finally contribute to the lighting, because these stray light components are confined to the inside of storing cavity 51, in the third embodiment of the present invention. Because the geometrical configuration is designed to satisfy Equation (1), light input from the inner wall portion of the storing cavity 51 can be prevented from leaking from the contour surface of the bulk-shaped lens 54 again. Consequently, it becomes possible to extract the inherent light energy from the LED chip, with extraction efficiency approximately the same as the internal quantum efficiency, without depending on geometry of the resin mold nor the reflection component of the mutual optic system.

As shown in FIG. 7A, a top surface of central LED 62 is arranged to become the position lower than top surfaces of four other LEDs 61, 63, . . . , 65 by $\Delta$. The images of five LEDs 61, 62, 63, . . . , 65 will be projected in the case of $\Delta=0$. However, these lights can be condensed as if one light is emitted from a single LED in an appearance, if we choose $\Delta$ approximately equals to the diameter (outer diameter) $2r_{LED}$ of LEDs 61, 62, 63, . . . , 65.

In addition, as LEDs 61, 62, 63, . . . , 65 to be used in the light-emitting unit of the third embodiment of the present invention, any LED of various kinds of color (wavelength) can be employed. Although the white LED is natural to a human eye for a lighting purpose, it is preferable to adjust wavelength of the light to the color being hated extremely by an intended animal, in order to scare off the animal. Therefore, as to the LEDs 61, 62, 63, . . . , 65, various kinds of configurations can be employed. For example, three pieces of LED chips including the red (R), green (G) and blue (B) chips can be stacked as shown in FIG. 3 and FIG. 4 so as to compose the LEDs 61, 62, 63, . . . , 65. Or, it may be closely disposed to each other in the quasi-planar topology at intervals of 100 μm or a less. In either the stacked structure or the configuration in quasi-planar topology, it becomes necessary that three independent wirings for biasing respective LED chips of three colors. In this case, from a resin mold, corresponding to the respective LED chips of different colors, a total of six pins can be extracted. In the inner electric wirings of the resin mold, six pins may be merged into two pins, so as to assemble the LED in a configuration having two external pins. In addition, the number of external pins becomes four, when one electrode (ground electrode) is elected as common. In this way, if the drive voltages of three pieces of LED chips, consisting of red (R) color, green (G) colors and blue (B) color chips, are controlled mutually independently, mixing of every color is possible. Therefore, it is possible to adjust the emitted light to the color being hated most by the animals, and if the animals learn after some time, it can be changed to another hated color.

Figure 8A:
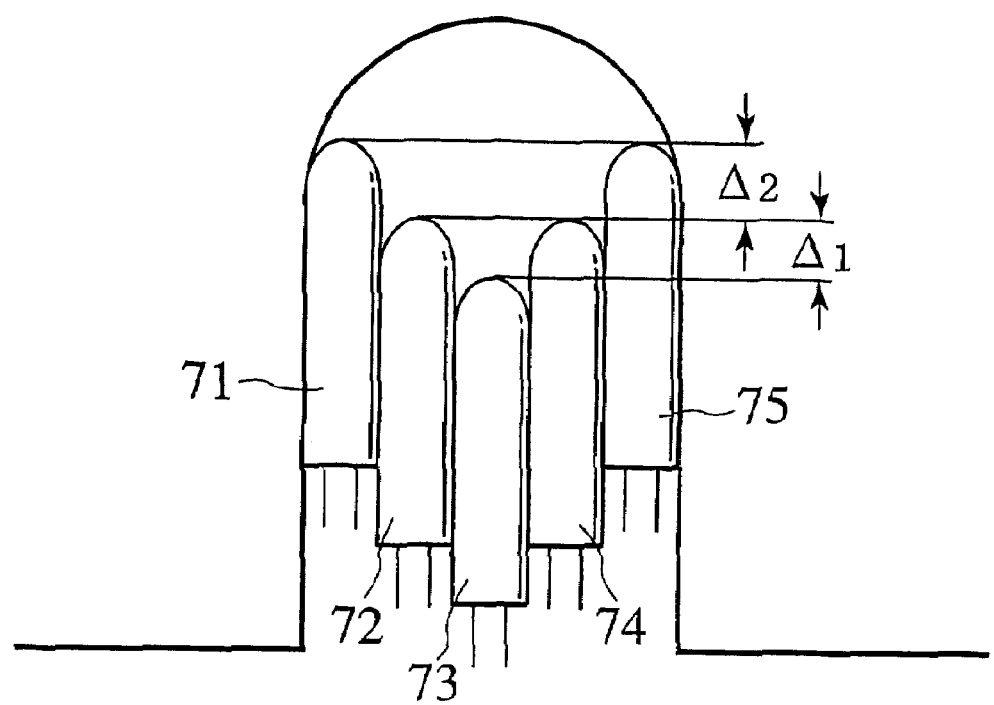
FIG. 8A is a schematic cross-sectional view regarding the well-shaped cavity in the light-emitting unit according to a modification of the third embodiment of the present invention.
Figure 8B:
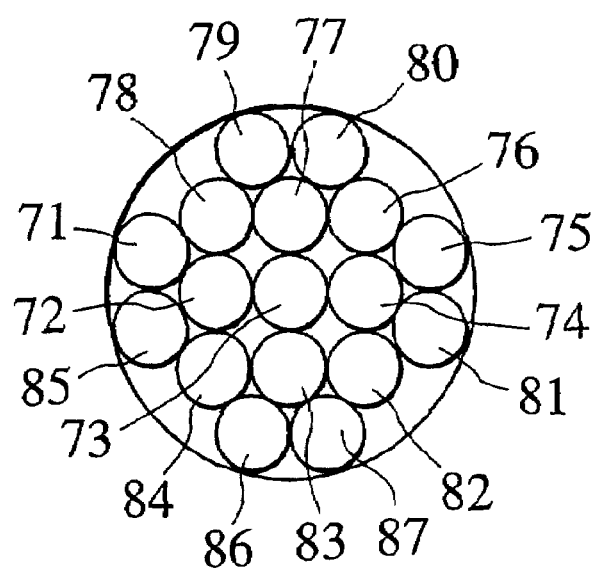

FIG. 8A is a schematic cross-sectional view showing the well-shaped cavity in the light-emitting unit according to a modification of the third embodiment of the present invention. As shown in FIG. 8A, the light-emitting unit according to a modification of the third embodiment of the present invention is structurally the same as FIG. 7A, but embraces plural (17 pieces) resin molded LEDs 71, 72, 73, . . . , 87 and each bulk-shaped lens encapsulates nearly completely the plural LEDs 71, 72, 73, . . . , 87. As shown in FIG. 8B, central LED 73 is surrounded in symmetry by 16 LEDs 71, 72, . . . , 87. In FIG. 8A, five times the outer diameter $2r_{LED}$ of LEDs 71, 72, 73, . . . , 87 is selected to be approximately equal to the inner diameter $2r_1$. As shown in FIG. 8A, the top surface of central LED 73 is disposed to a position lower by $\Delta_1$ than top surfaces of four LEDs 72, 74, 77, 83 adjacent to the LED 73. Furthermore, the top surfaces of four LEDs 72, 74, 77, 83 are disposed to positions lower by $\Delta_2$ than top surfaces of other LEDs 71, 75, 79, 80, 81, 82, 85, 86 adjacent to the outside of the four LEDs 72, 74, 77, 83. In the case of $\Delta_1=\Delta_2=0$, images of 17 LEDs 71, 72, 73, . . . , 87 will be projected. However, these lights can be condensed as if one light is emitted from a single LED in an appearance, if we choose both $\Delta_1$ and $\Delta_2$ are approximately equal to the diameter (outer diameter) $2r_{LED}$ of LEDs 71, 72, 73, . . . , 87. Because the geometry to satisfy Equation (1) is preferable in the case of FIG. 8A and 8B, if the diameter (outer diameter) $2r_{LED}$=2-3 mm$^\Phi$ measured at the column shaped portion of each of the LEDs 71, 72, 73, . . . , 87, it becomes diameter (inner diameter) $2r_1$=10-15 mm$^\Phi$ of the storing cavity of the bulk-shaped lens. From Equation (1), the diameter (outer diameter) $2r_0$ of the column shape portion of the bulk-shaped lenses becomes a level of 30-150 mm$^\Phi$, achieving the enlargement furthermore.

Other Embodiments

As explained above, the present invention is described by means of the first to third embodiments, the statement of disclosure or the drawings should not be understood as limiting the invention. The alternate embodiments will become clear to a person skilled in the art from the disclosure.

For example, if LEDs of various kinds of colors are prepared and arranged, each displacing little by little from a central axis of rotation, various colors can be displayed at the same time so as to surprise animals more effectively. In particular, with the architecture that three LED chips of RGB are merged in the well-shaped cavity, and independent biases are applied to the three LED chips respectively, arbitrary colors can be chosen, so that the color of the eyes of Raptores and hue resembled the marking of snakes. To show the non-emission portion by black, it is preferable to paint the background black. In addition, disposing LEDs of plural colors in a predetermined relative relation, by spinning the rotating body, an image of the rotating eyeball can be displayed.

In addition, two or more elements of the first to third embodiments of the present invention can be combined together. For example, in the case of a turbofan engine, the combination that the frightening apparatus of the first embodiment is attached to the fan blade, and the frightening apparatus of the second embodiment is attached to the tip of the cowling of the engine can be employed. Here, in the second embodiment, plural light-emitting units are sequentially driven by the electrical method, the plural light-emitting units have the bullet-like bulk-shaped lens and LEDs installed therein, respectively.

Furthermore, in the first embodiment of the present invention, by synchronizing with the rotational frequency of the rotating body, if LEDs are turned on and off, the eyeball of Raptores can be displayed as if it is blinking. In addition, synchronizing with the rotational frequency, if the light emission positions are controlled two-dimensionally, a pattern having the same ratio of the eyeball of Raptores (for example, 1:3-1:5) can be displayed.

Figure 9A:
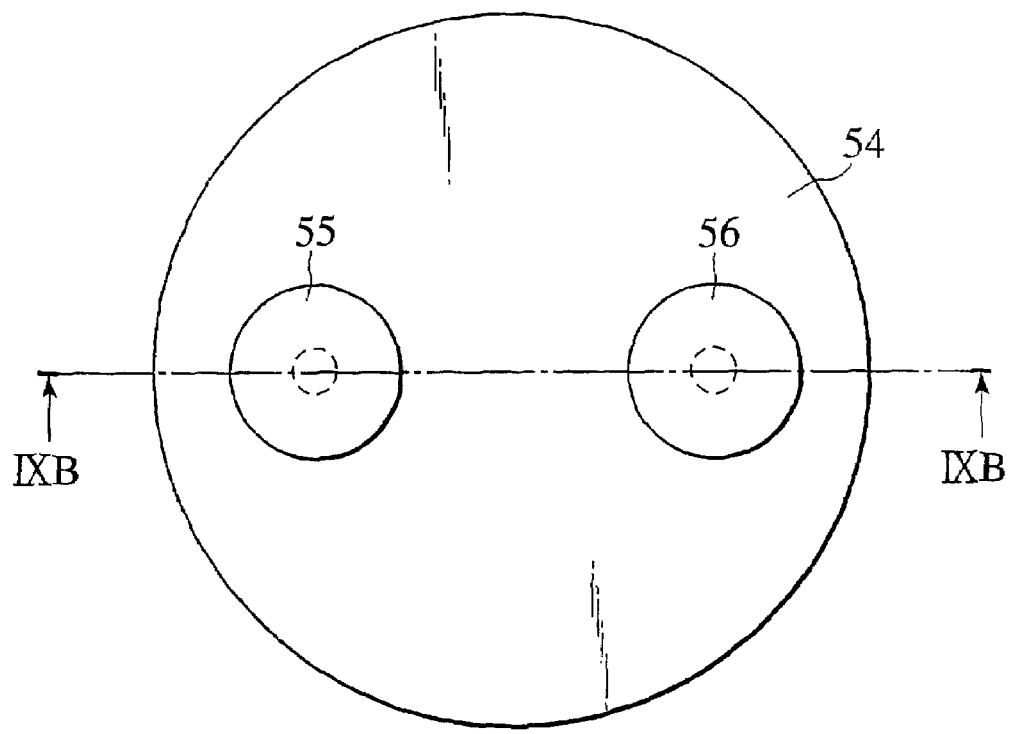
FIG. 9A is a schematic plane view showing the frightening apparatus of another embodiment of the present invention.
Figure 9B:
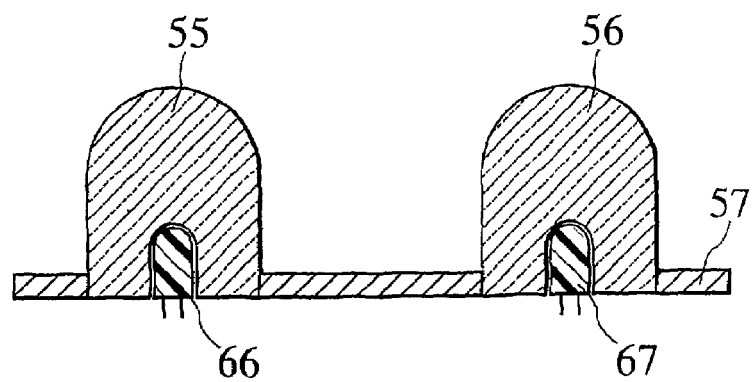
FIG. 9B is a cross-sectional view drawn along IXB-IXB direction in FIG. 9A.

Furthermore, most simply, as shown in FIGS. 9A and 9B, it is possible to dispose on a flat board 57 two bulk-shaped lens 55, 56, imitating after the eyeballs of an animal, where two LEDs 66, 67 are installed in the well-shaped cavity at back surface side of the two bulk-shaped lens 55, 56. Instead of the flat board 57, it is more preferable to employ a curved surface so as to display a three dimensional structure such as for example a mask of animals.

Furthermore, for the case of the structure shown in FIGS. 9A and 9B, it is preferable that two LEDs 66, 67 are used in the architecture of three LED chips of RGB. That is to say, if the three LED chips of RGB are assembled in proximity each other so as to form the stacked structure as shown in FIG. 3 and FIG. 4 or to form the quasi-plane structure, and based on the empirical rules, by adjusting color to that being hated extremely by the intended animals, the scarecrow effect can be increased. In addition, because animals will learn, it is possible to use a dynamical display, in which another colors can be displayed or the light-emitting units are flashing, so as to suppress the decrease of the scarecrow effect.

Furthermore, inside of the well-shaped cavity at the backside of the bulk-shaped lens 55, 56, sets of plural LEDs may be installed similar to the configuration shown in FIGS. 7A, 7B, 8A, 8B. And, each plural LEDs mayhave the architecture of three LED chips of RGB, by which colors can be adjusted to those being hated extremely by the animals.

In this way the present invention includes inherently the various embodiments, which are not described here. Therefore, technical scopes of the present invention are prescribed only by the description of claims, being proper from the above explanation.

INDUSTRIAL APPLICABILITY

Farming and the aircraft industry that experience damages by wild animals such as rodents including mice, rats, mammals including badgers, wild boars, monkeys, deer, bears, foxes, and birds become problems can take advantages of the present invention. Furthermore, in order to prevent the entry of stray cats into property, or in order to scare off crows of a street, the present invention can be employed in homes and in the restaurant business.

The invention claimed is:

1. A rotating apparatus for frightening an animal by illuminating a collimated light against the animal along the rotating axis of the rotating apparatus, comprising:
   a rotating body having the rotating axis;
   a bulk-shaped lens for condensing light along an optical axis co-axial with the rotating axis, wherein the bulk-shaped lens is disposed at a tip of the rotating body and rotates with the rotating body, the bulk-shaped lens comprising:
      a bulk-shaped lens body identified by a top surface, a bottom surface and a contour surface, the center of the top and bottom surfaces defining the optical axis in a direction from the bottom surface to the top surface; and
      a well-shaped cavity implemented in the inside of the lens body, aligned along the optical axis, allocated at a backside of the lens body, and
   a semiconductor light-emitting element for emitting the light, installed in the cavity,
   wherein a ceiling surface of the cavity serves as a main entrance surface, an inner wall portion of the cavity other than the ceiling surface serve as an effective entrance surface, the top surface of the lens body serves as an exit surface for defining a divergence angle of the light along the optical axis, and outer diameter of contour surface of the bulk-shaped lens is larger than three times and smaller than ten times of inner diameter of the cavity, and the bulk-shaped lens rotate with the rotating body.

2. The rotating apparatus of claim 1, wherein the semiconductor light emitting element comprises three LED chips, emitting lights in red, green, blue respectively, stacked vertically or disposed closely, so that emitted light color can be changed by adjusting bias of each LED chip.

* * * * *